United States Patent [19]
Gillenwater et al.

[11] Patent Number: 5,404,359
[45] Date of Patent: Apr. 4, 1995

[54] FAIL SAFE, FAULT TOLERANT CIRCUIT FOR MANUFACTURING TEST LOGIC ON APPLICATION SPECIFIC INTEGRATED CIRCUITS

[75] Inventors: Russell L. Gillenwater; Davoud Safari, both of Round Rock; Gary D. Owens, Austin, all of Tex.

[73] Assignee: Tandem Computers Incorporated, Cupertino, Calif.

[21] Appl. No.: 906,196

[22] Filed: Jun. 29, 1992

[51] Int. Cl.⁶ .................... G01R 31/28; G06F 15/60
[52] U.S. Cl. .................................. 371/22.5; 324/73.1
[58] Field of Search .................... 371/22.5, 22.3, 14; 307/442; 324/73.1, 158 T, 158 R

[56] References Cited

U.S. PATENT DOCUMENTS

| | | | |
|---|---|---|---|
| 3,423,728 | 1/1969 | Wissel | 371/14 |
| 3,581,075 | 5/1971 | Mattson | 371/14 |
| 3,600,604 | 8/1971 | Thorne-Booth | 307/442 |
| 4,672,610 | 6/1987 | Salick | 371/27 |
| 4,779,273 | 10/1988 | Boucler et al. | 371/27 |
| 4,896,055 | 1/1990 | Fujii et al. | 371/14 |
| 4,914,379 | 4/1990 | Magno | 371/22.3 |
| 5,065,047 | 11/1991 | Igari et al. | 307/442 |
| 5,068,603 | 11/1991 | Mahoney | 324/158 T |
| 5,144,230 | 9/1992 | Katoozi et al. | 324/73.1 |
| 5,155,432 | 10/1992 | Mahoney | 324/158 R |

OTHER PUBLICATIONS

Xilinx; "The Programmable Gate Array Data Book"; 1989.

*Primary Examiner*—Ellis B. Ramirez
*Attorney, Agent, or Firm*—Graham & James

[57] ABSTRACT

An application specific integrated circuit (ASIC) includes ASIC logic and test logic that includes a fail-safe circuit and test logic circuitry. The test logic in conjunction with input and output test cells provides manufacturing test capability for the ASIC logic with a plurality of input pins and a plurality of output pins. The test logic generates several control signals that can affect operation of the ASIC logic. If any one of these signals is driven active by either a failure or a defect, the ASIC logic would be rendered inoperative. Consequently, each of these control signals is routed to the fail-safe circuit. These control signals include, for example, tri-state and reset signals and other control signals generated by test logic circuitry for the built-in testing of the ASIC. The fail-safe circuit generates a fail-safe control output signal for a corresponding control input signal from the test logic circuitry only during manufacturing testing when a fail-safe enable signal is applied to the fail-safe circuit. Preferably, the fail-safe enable signal is provided on one of the plurality of pins connected to the test logic so that the fail-safe enable signal cannot be generated by a failure or defect in the test logic circuitry.

22 Claims, 18 Drawing Sheets

| INSTRUCTION | INSTRUCTION REGISTER BITS | | | | | |
|---|---|---|---|---|---|---|
| | b15..b12 | b11..b8 | b7..b4 | b3,b2 | b1 | b0 |
| EXTEST | 0000 | 0000 | 0000 | 00 | 0 | 0 |
| INTEST | 0111 | XXXX | XXXX | 00 | X | X |
| SAMPLE/PRELOAD | 0101 | XXXX | XXXX | 00 | X | X |
| BYPASS | 1111 | 1111 | 1111 | 11 | 1 | 1 |
| IDREG | 1000 | XXXX | XXXX | 00 | X | X |
| R0 | 1110 | XXXX | XXXX | 00 | X | X |
| BSBIST (sample) | 1101 | XXXX | 0001 | 00 | X | X |
| BSBIST (run) | 1101 | XXXX | 0010 | 00 | X | X |
| ISCAN (load) | 0100 | XXXX | 0001 | 00 | X | X |
| ISCAN (run) | 0100 | XXXX | 0000 | 00 | X | X |
| IREG | 0010 | XXXX | XXXX | 10 | X | X |
| CHPRST | XXXX | XXXX | XXXX | 01 | X | X |
| CHPTRIST | XXXX | XXXX | XXXX | 01 | X | X |

FIG. 11

FAIL SAFE, FAULT TOLERANT CIRCUIT FOR MANUFACTURING TEST LOGIC ON APPLICATION SPECIFIC INTEGRATED CIRCUITS

BACKGROUND OF THE INVENTION

1. Field of the Invention

This invention relates generally to application specific integrated circuits (ASICs) and in particular to a fail-safe structure that is included within the ASIC manufacturing test circuitry to assure that the test circuitry does not degrade the performance of the ASIC.

2. Description of the Related Art

In an application specific integrated circuit (ASIC), there are two general problems encountered in the manufacturing testing process. The first problem is that the ASIC logic itself is defective and the second is that the circuitry used to get signals into the ASIC logic and out of the ASIC logic is defective. Consequently, test logic is built into an ASIC that is used only in the manufacturing process to verify the operability of the ASIC. After the manufacturing process is complete, the ASIC test circuitry is passive and is no longer required or used.

Typically, the ASIC built-in test logic includes a built-in self-test (BIST) capability as well as a boundary scan capability. ASIC 100 (FIG. 1) includes both the built-in self-test capability and the boundary scan capability. ASIC 100 includes test logic 120, which controls the built-in self-test and the boundary scan capability, and ASIC logic 110.

The boundary scan capability is provided by input boundary scan register cells (BSRCs) 103-1 to 103-4, output boundary scan register cells 104-1 to 104-4, and test logic 120. The built-in self-test capability is provided by pseudo-random number generator cells 105-1 to 105-4, pseudo-random number signature analyzer cells 106-1 to 106-4, and test logic 120. ASIC 100 has four input pins 101-1 to 101-4 and four output pins 102-1 to 102-4.

As illustrated in FIG. 1, the configuration of the input and output boundary scan register cells 103-1 to 103-4 and 104-1 to 104-4 and pseudo-random number generator and signature analyzer cells 105-1 to 105-4 and 106-1 to 106-4 for each input pin and output pin is the same. Thus, the following description for input pin 101-2 and output pin 102-2 is applicable for any of the other input pins and output pins, respectively, of ASIC 100.

Input pin 101-2 drives an input boundary scan register cell 103-2, which in turn provides an input signal to pseudo-random generator cell 105-2 that in turn drives an input line of ASIC logic 110. Similarly, a signal on an output line of ASIC logic 110 drives pseudo-random number signature analyzer cell 106-2. The output signal of cell 106-2 drives output boundary scan cell 104-2, which in turn drives output pin 102-2.

Test logic 120 drives control lines for the input and output boundary scan cells and the pseudo-random number generator and signature analyzer cells. Typically, the built-in self-test and the boundary scan capability form an on-chip monitor architecture that conforms to IEEE 1149.1 standard. This standard requires that ASIC 100 have four additional pins, which are test data in signal pin TDI, test data out signal pin TDO, test mode select signal pin TMS, and test clock pin TCK. Test reset pin TRST* is an optional pin, but when test reset pin TRST* is used, the standard defines its use. In addition, most ASICs include, as illustrated for ASIC 100, an asynchronous ASIC reset pin RST and an asynchronous three-state output pin TRIST for use in normal operation of ASIC logic. However, for manufacturing tests, test logic 120 also typically includes a means for generating signals on lines TRISTATE and RESET to ASIC logic 110.

The built-in self-test typically includes an internal scan capability in addition to the boundary scan capability. The internal scan capability receives input signals from pin TDI, passes the signals through test logic 120 to ASIC logic 110 and the resulting signals from ASIC logic 110 are passed through test logic 120 to pin TDO. Test logic 120 generates a signal on line SS to configure flip-flops in ASIC logic 110 for the internal scan and in addition provides a clock signal CLK for the scan.

A common problem in manufacturing testing of ASIC 100 is that ASIC 100 fails to operate. The ASIC failure could be due to a multiplicity of reasons. For example, ASIC logic 110 could be defective. Alternatively, either test logic 120 or one or more of the cells used in the built-in self-test and boundary scan capability could be defective, and therefore prevent operation of the ASIC 100.

Unfortunately, at the time of manufacturing testing, there is no ability to determine the basis for the failure and typically the solution is to start over in the fabrication of ASIC 100 within a redesign of ASIC 100.

Also, either the boundary scan capability or the built-in self-test capability may introduce problems in the operation of ASIC 100, after ASIC 100 is provided to the customer. Ideally, the manufacturing test circuitry in ASIC 100 is only used during the manufacturing check out period and after that time is passive and its presence is unknown to the user. However, if, for example, the signal on line SS goes active after the customer receives ASIC 100, ASIC 100 goes into the internal scan mode, and therefore is no longer functional. Similarly, failures in test logic 120 may generate active signals on line TRISTATE or RESET that render ASIC logic 110 inoperable.

Failures in test logic 120 may create erroneous conditions in the input boundary scan register cells, the output boundary scan register cells, the pseudo-random number generator cells or the pseudo-random number signature analyzer cells. Any one of these faults in test logic 120 renders ASIC 100 inoperable.

The faults that may render ASIC 100 inoperable are further demonstrated by examining typical cells in ASIC 100 that are used that are used only for manufacturing testing.

A typical structure for an input boundary scan register cell 203 and a typical structure for an output boundary scan register cell 304 are illustrated in FIGS. 2 and 3, respectively. Input boundary scan register cells 103-1 to 103-4 are identical and are represented by cell 203 (FIG. 2). Output boundary scan register cells 104-1 to 104-4 are also identical and are represented by cell 304 (FIG. 3). Moreover, the basic structure of cell 203 and cell 304 are the same. The only difference in cells 203 and 304 is the source of the input signal for the cell and the use of the output signal from the cell.

Each cell 203, 304 includes two two-to-one multiplexers 211, 214 and 311, 314 and two D-type flip-flops 212, 213 and 312, 313. Test logic 120 drives five control lines which are used by cells 203, 304. If the signal on control line MODE is active, the input signal to cell 203, 304 is not simply passed through the cell. Rather, multiplexer 214, 314 passes the signal generated by D-type flip-flops 212, 213 and 312, 313 to the cell output line. Therefore, if test logic 120 drives the signal on line MODE permanently active, ASIC 100 is rendered useless.

A typical structure for a pseudo-random number generator cell 405 and a typical structure for a pseudo-random number signature analyzer cell 506 are illustrated in FIGS. 4 and 5 respectively. Pseudo-random number generator cell 405 (FIG. 4) represents pseudo-random number generator cells 105-1 to 105-4 and pseudo-random number signature analyzer cell 506 (FIG. 5) represents pseudo-random number signature analyzer cells 106-1 to 106-4. Each cell 405, 506 includes an exclusive OR gate, 416, 516, a D-type flip-flop, 417, 517, and a two-to-one multiplexer 418, 518. Each cell 405, 506 receives three control signals from test logic 120. If signal TEST_MODE is active, the pseudo-random number built-in self-test feature is enabled. Accordingly, if signal TEST_MODE goes active due to a fault in test logic 120, ASIC 100 is defective.

One difference in cells 405 and 506 is the source of the input signal and the use of output signal of the cell. The other difference is the number of input lines to the exclusive OR gate.

FIG. 6 illustrates a typical cell 600 within ASIC logic 110 that is used for internal scan testing. If the signal on line SS goes active for whatever reason, the ASIC logic that utilizes the flip-flops in the internal scan cell 600 becomes useless.

Thus, while the boundary scan capability and the built-in self-test capability included in ASIC 100 improved the testability of ASIC 100, these features also provide additional failure modes for ASIC 100. If these failure modes require re-design of ASIC 100 during manufacture, significant costs and delays in time to market are incurred. If these failure modes occur while ASIC 100 is being used by a customer, the customer is severely inconvenienced by the costs associated with the down time of the piece of equipment as well as the costs of replacing the failed ASIC. These losses result from passive equipment, which is used only in manufacturing testing, subsequently failing in a way that destroys the functionality of ASIC 100.

SUMMARY OF THE INVENTION

In accordance with the principles of this invention, a built-in test circuit in an application specific integrated circuit(ASIC) includes a test logic circuit with a fail-safe circuit for generating a plurality of fail-safe fault-tolerant signals that control input signals, output signals, and internal signals of an ASIC logic circuit in the ASIC. In one embodiment, the built-in test logic circuit, hereinafter "test logic circuit," generates a plurality of intermediate control signals that are used only in manufacturing testing. The intermediate control signals are for control of input signals, output signals, and internal signals of the ASIC logic during built-in testing. These intermediate control signals are input signals to the fail-safe circuit control. In response to an intermediate control signal A, the fail-safe circuit generates a corresponding fail-safe control signal A_FS only if the fail-safe circuit simultaneously receives a fail-safe enable signal. Preferably, the fail-safe enable signal is provided directly from a pin of the ASIC.

Thus, during manufacturing testing when the fail-safe enable signal is applied on the pin of the ASIC, the test logic circuit performs in a manner similar to the prior art test logic circuit. However, if one of the intermediate control signals from the test logic circuit to the fail-safe circuit goes active subsequent to the manufacturing tests, the normal operation of the ASIC is unaffected. Since the enable signal to the fail-safe circuit is unavailable after manufacturing testing is completed, no fail-safe control signal is generated by the fail-safe circuit. Therefore, the fail-safe circuit eliminates the faults of prior art ASICs associated with failures or defects in the test logic circuitry that generated control signals that in turn rendered the prior art ASIC inoperative when used by a customer.

Moreover, the fail-safe circuit of this invention eliminates the need to start over in the manufacturing of the ASIC to isolate the problem when the ASIC appears defective during manufacturing testing. The fail-safe circuit isolates the ASIC logic circuit from defects and failures in the test logic circuit. Thus, problems in the test logic circuit no longer render ASIC logic inoperative. Consequently, the test engineer may proceed with debugging the ASIC logic to ascertain whether the logic is functional. The ability to independently verify the operability of the ASIC logic eliminates the need to start a redesign of that logic when the ASIC initially appears inoperable. This saves both time and expense when such a problem occurs.

In one embodiment, an intermediate control signal from the test logic circuit drives a first input line of a logic gate. A line carrying a fail-safe enable signal is connected to a second input line of the logic gate. The logic gate generates an active fail-safe control signal on the output line of the logic gate only in response to both the fail-safe enable signal and the intermediate control signal. Thus, during a manufacturing test the fail-safe control signal is held active and at all other times the fail-safe control signal is inactive. Therefore, the logic gate prevents spurious intermediate control signals that may be generated by the ASIC test logic from affecting the operation of the ASIC.

BRIEF DESCRIPTION OF THE DRAWINGS

FIG. 11 is a diagram of the signals generated by instruction decode of FIG. 9 for various bits patterns in the instruction register.

DETAILED DESCRIPTION

Figure 1:
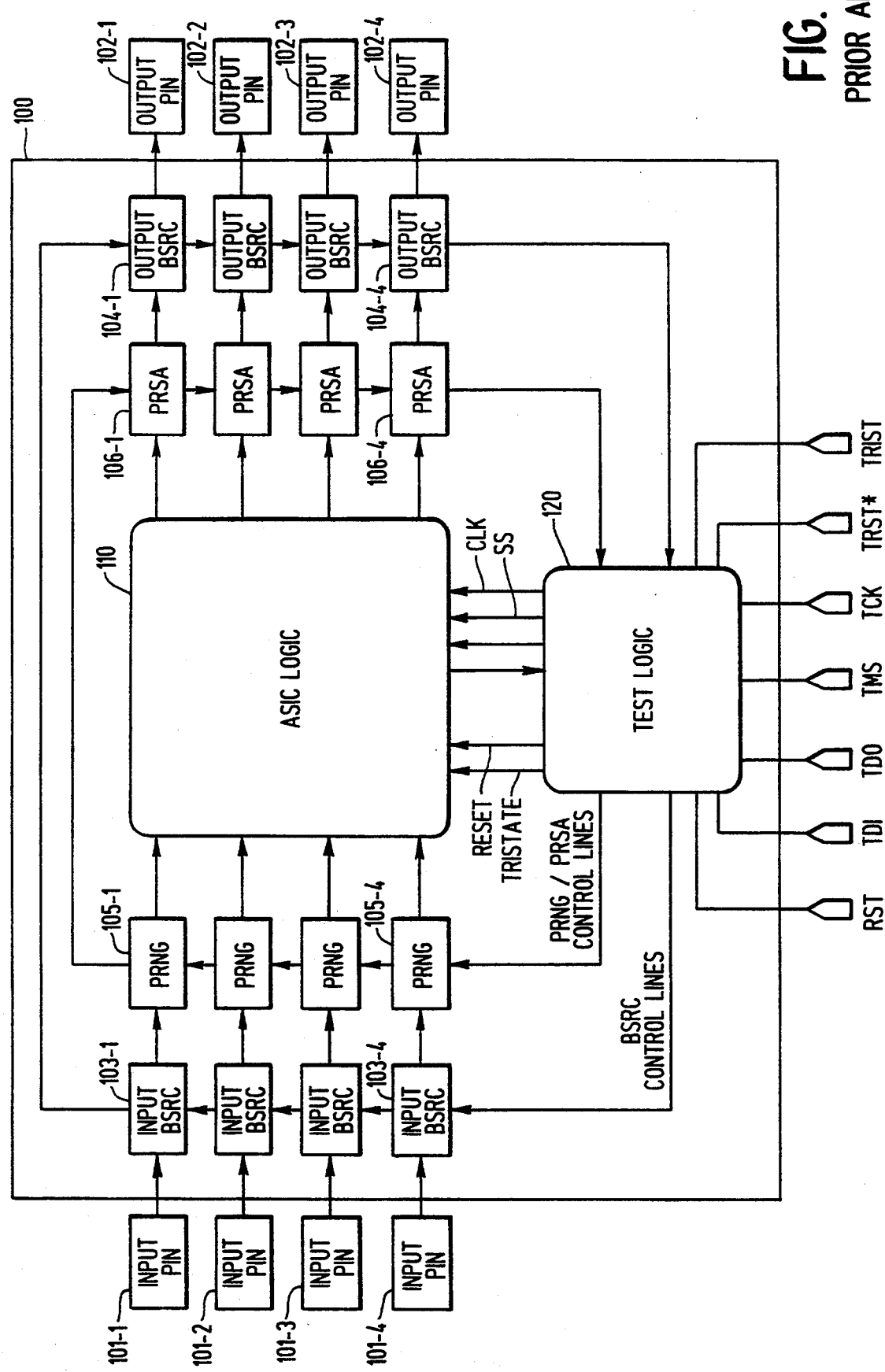
FIG. 1 is a block diagram of a prior art ASIC with input boundary scan register cells, output boundary scan register cells, pseudo-random number generator cells and pseudo-random number signature analyzer cells, along with test logic for built-in testing of the ASIC.
Figure 2:
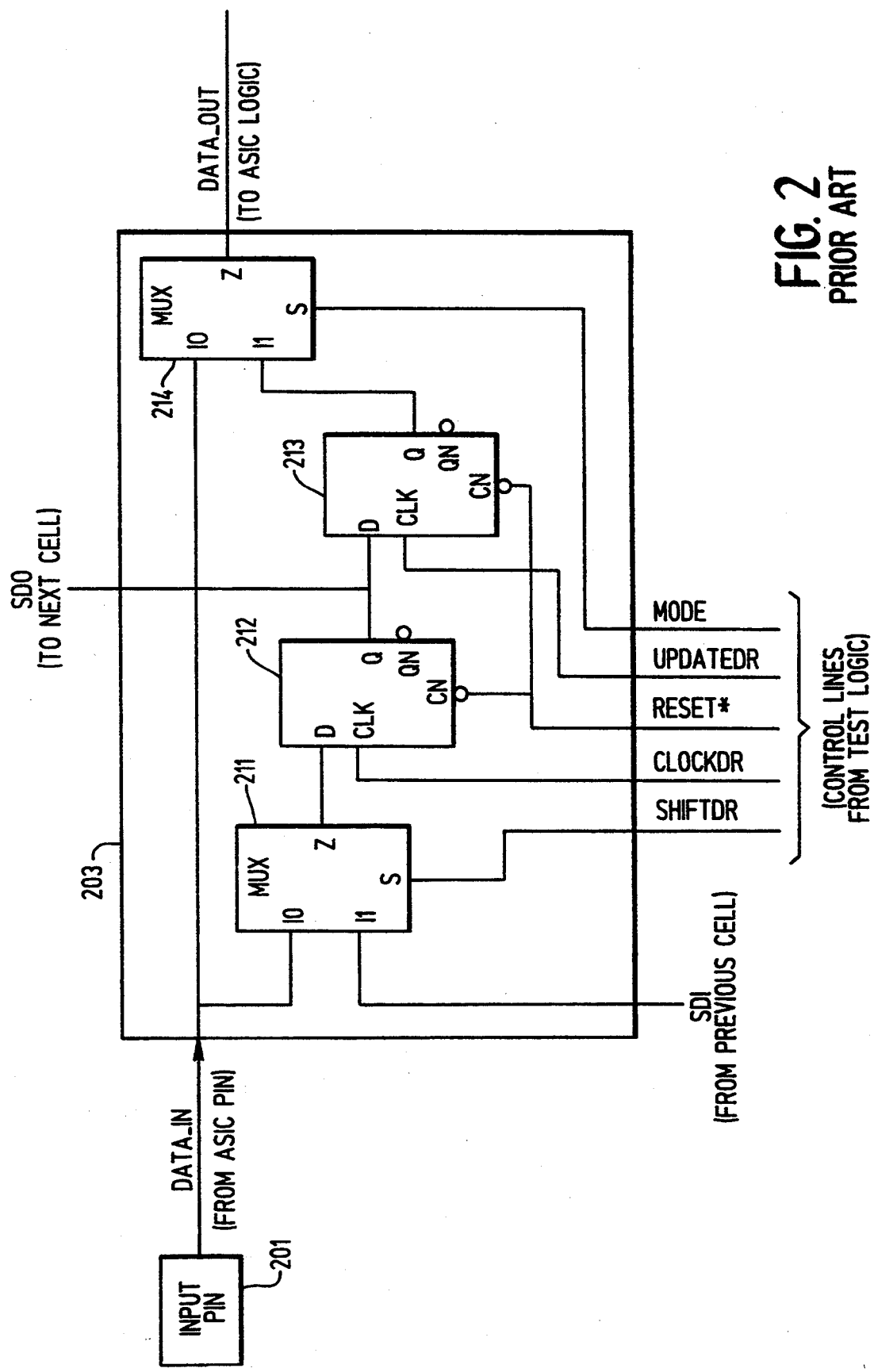
FIG. 2 is a schematic diagram of a prior art input boundary scan register cell.
Figure 3:
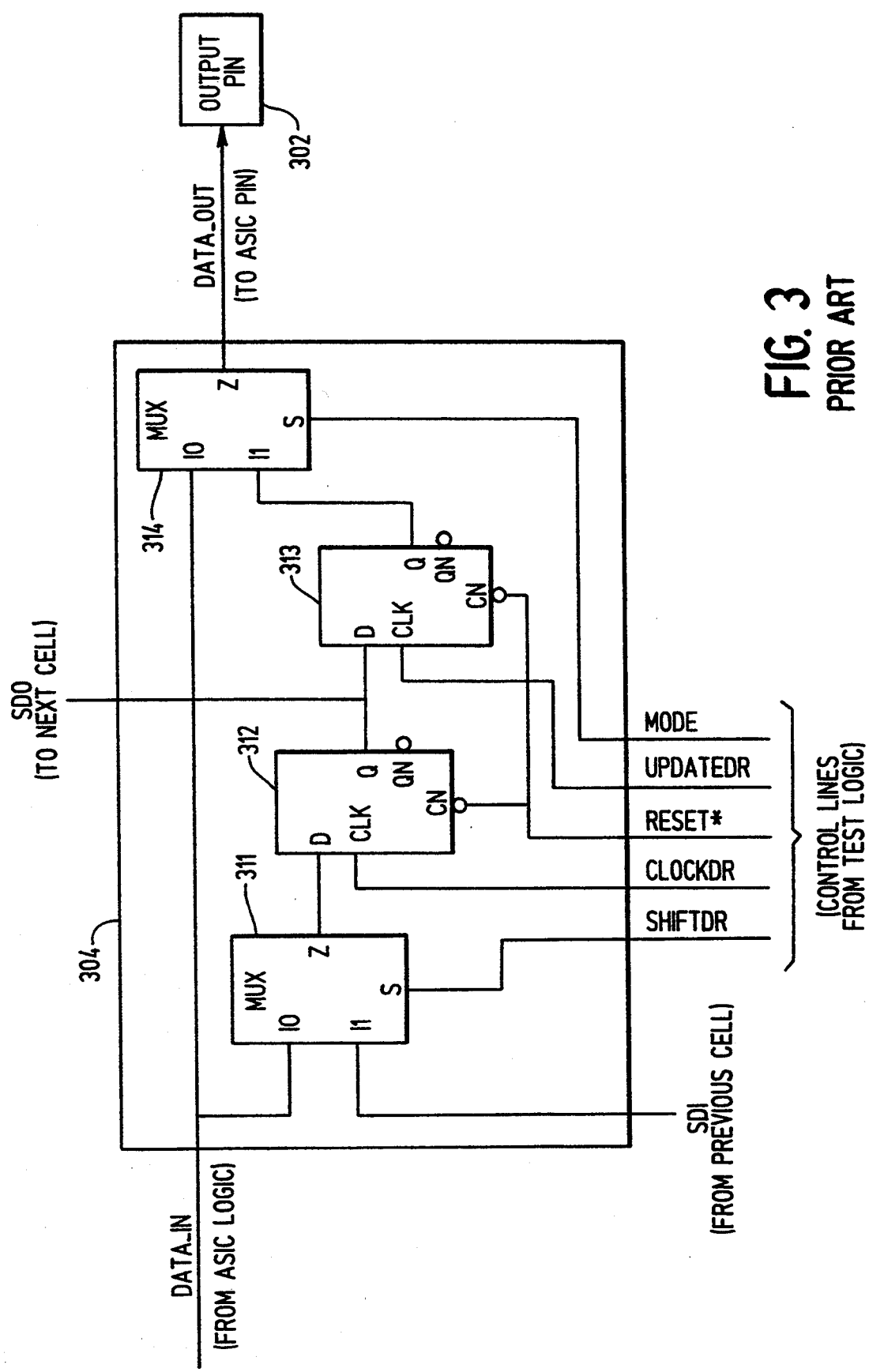
FIG. 3 is a schematic diagram of a prior art output boundary scan register cell.
Figure 4:
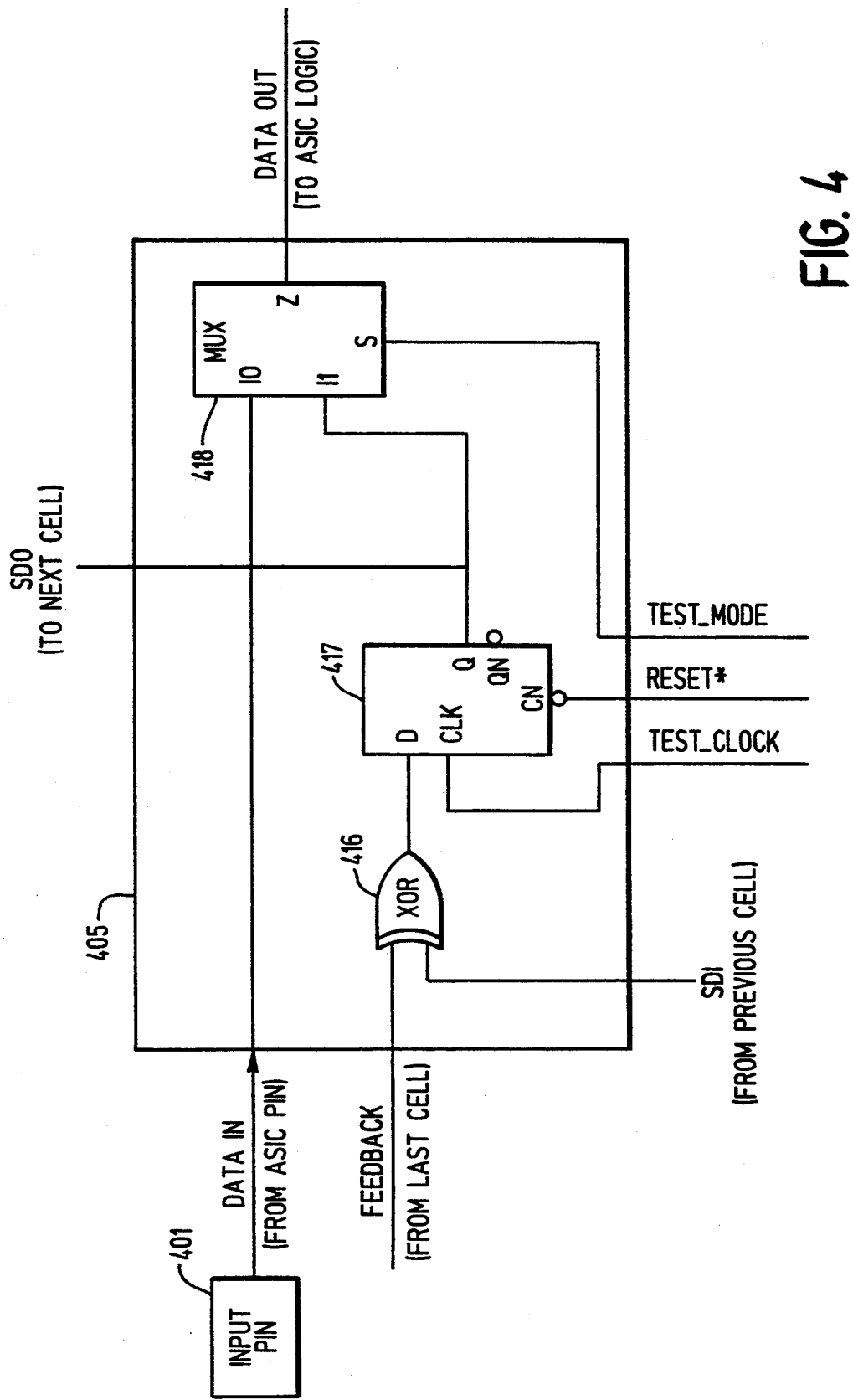
FIG. 4 is a schematic diagram of a prior art pseudo-random number generator cell.
Figure 5:
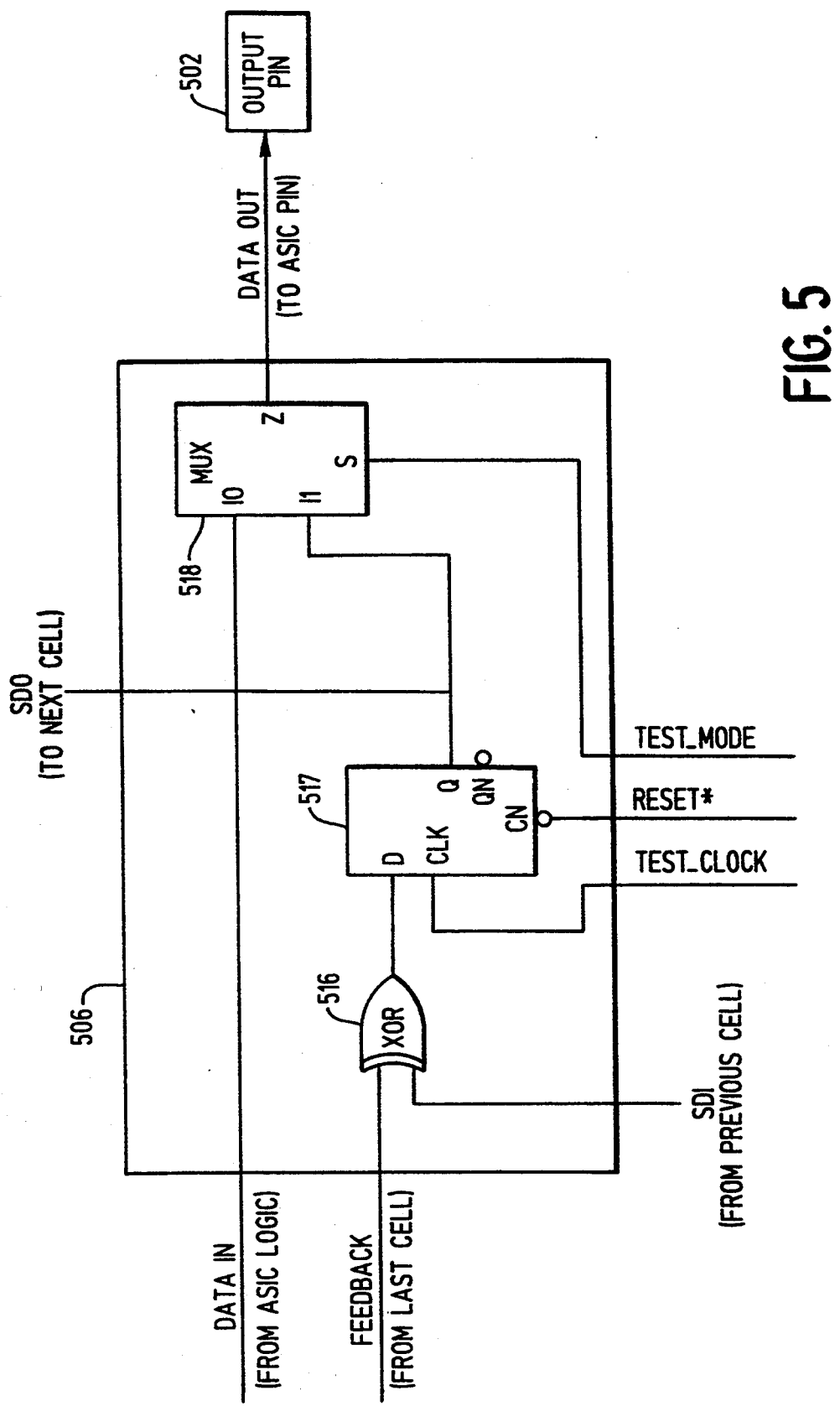
FIG. 5 is a schematic diagram of a prior art pseudo-random number signature analyzer cell.
Figure 6:
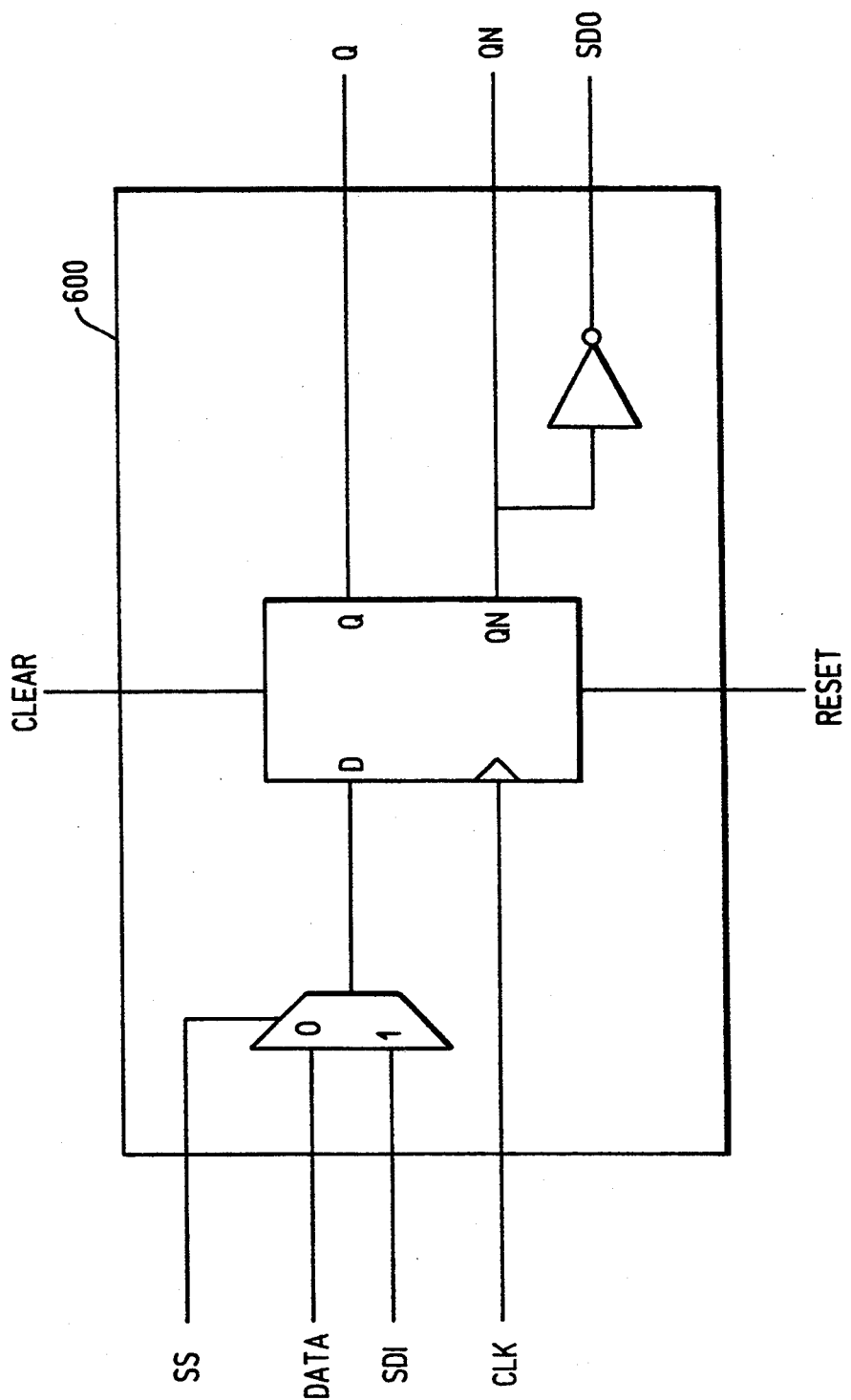
FIG. 6 is a schematic diagram of a prior art structure used for internal scan testing of the ASIC logic.
Figure 7:
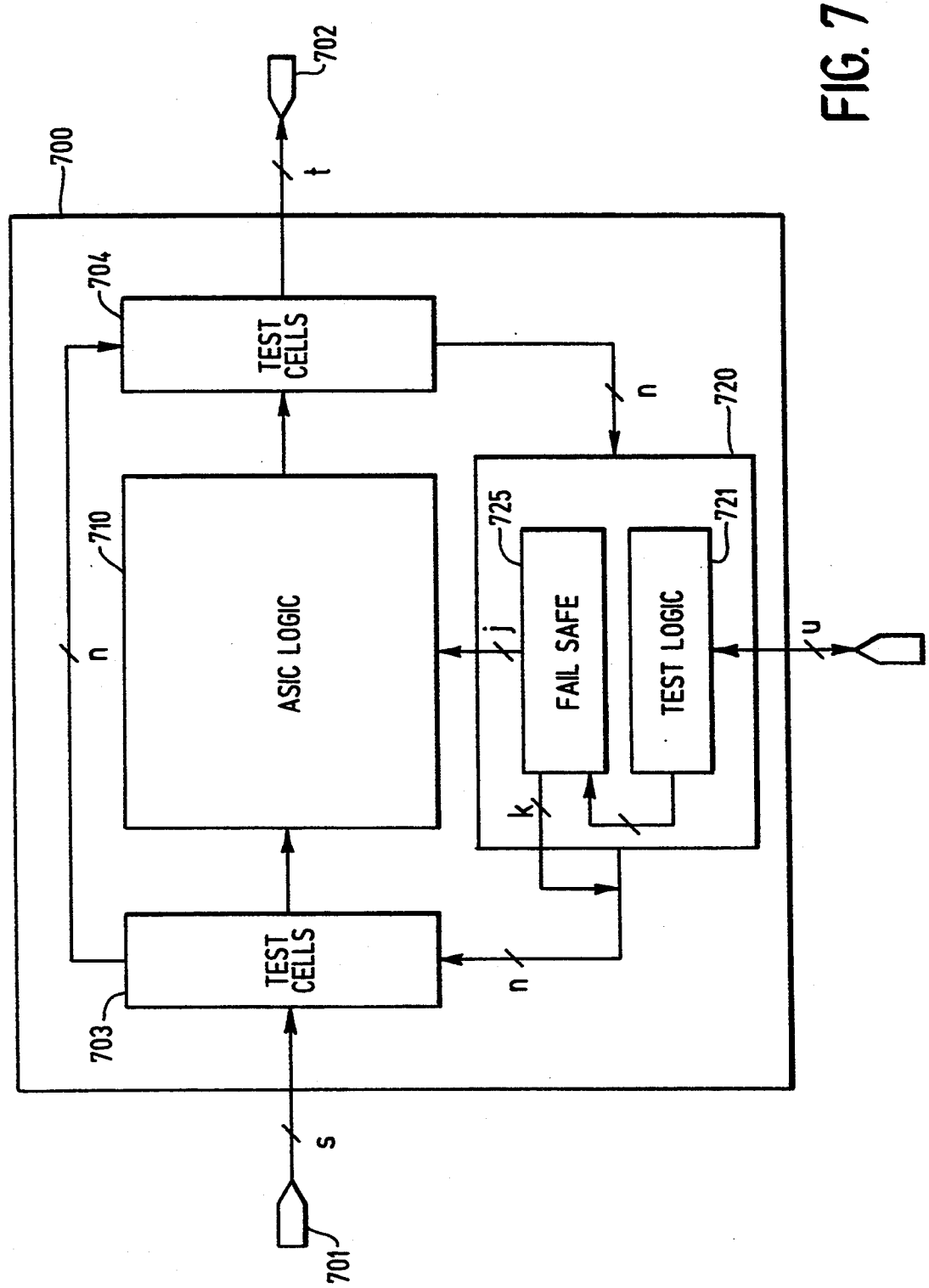
FIG. 7 is a block diagram of an ASIC that includes a fail-safe circuit within the test logic according to the principles of this invention.

In accordance with this invention, an application specific integrated circuit 700 includes ASIC logic 710 and test logic 720 that includes a fail-safe circuit 725 and test logic circuitry 721. Test logic 720 in conjunction with test cells 703 and 704 provides manufacturing test capability for ASIC logic 710 with a plurality "s" of input pins 701 and a plurality "t" of output pins 702. ASIC logic 710 is a logic circuit that is designed by the user to perform the logic operation required for a particular application. Such logic circuits are well-known to those skilled in the art.

As described more completely below, test logic 720 generates several control signals that affect operation of ASIC logic 710. If any one of these signals is driven active by either a failure or a defect, ASIC logic 710 would be rendered inoperative. Consequently, each of these control signals is routed to fail-safe circuit 725. These control signals include, for example, tri-state and reset signals and other control signals generated by test logic circuitry 721 for the built-in testing of ASIC 700.

Fail-safe circuit 725 generates a fail-safe control output signal for a corresponding control input signal from test logic circuitry 721 only during manufacturing testing when a fail-safe enable signal is applied to fail-safe circuit 725. Preferably, the fail-safe enable signal is provided on one of the plurality "u" of pins connected to test logic 720 so that the fail-safe enable signal cannot be generated by a failure or defect in test logic circuitry 721. Moreover, since a control signal generated by test logic circuitry 721 does not result in generation of a fail-safe control signal by fail-safe circuit 725 unless the fail-safe enable signal is active, the control signal from test logic circuitry 721 is referred to as an "intermediate logic control signal" to differentiate that signal from the actual fail-safe control signal generated by fail-safe circuit 725.

Thus, during manufacturing testing when the fail-safe enable signal is applied on the one pin in the plurality "u" of pins, test logic 720 performs in a manner similar to the prior art. However, if one of the intermediate logic control signals from test logic circuitry 721 to fail-safe circuit 725 goes active subsequent to the manufacturing tests, ASIC 700 is unaffected. Since the fail-safe enable signal to fail-safe circuit 725 is unavailable, no fail-safe control output signal is generated by fail-safe circuit 725. Therefore, fail-safe circuit 725 eliminates the faults of prior art ASICs associated with failures or defects in test logic circuitry 721 that generated control signals that in turn rendered ASCI 700 inoperative when used by a customer.

Moreover, fail-safe circuit 725 eliminates the need to start over in the manufacturing of ASIC 700 to isolate the problem when ASIC 700 appears defective during manufacturing testing. Fail-safe circuit 725 isolates ASIC logic 710 from defects and failures in test logic circuitry 721. Thus, problems in test logic circuitry 721 no longer render ASIC logic 710 inoperative. Consequently, the test engineer may proceed with debugging ASIC logic 710 to ascertain whether the logic is functional. The ability to independently verify the operability of the ASIC logic eliminates the need to start a redesign of that logic when ASIC 700 initially appears inoperable. This saves both time and expense when such a problem occurs.

Figure 8:
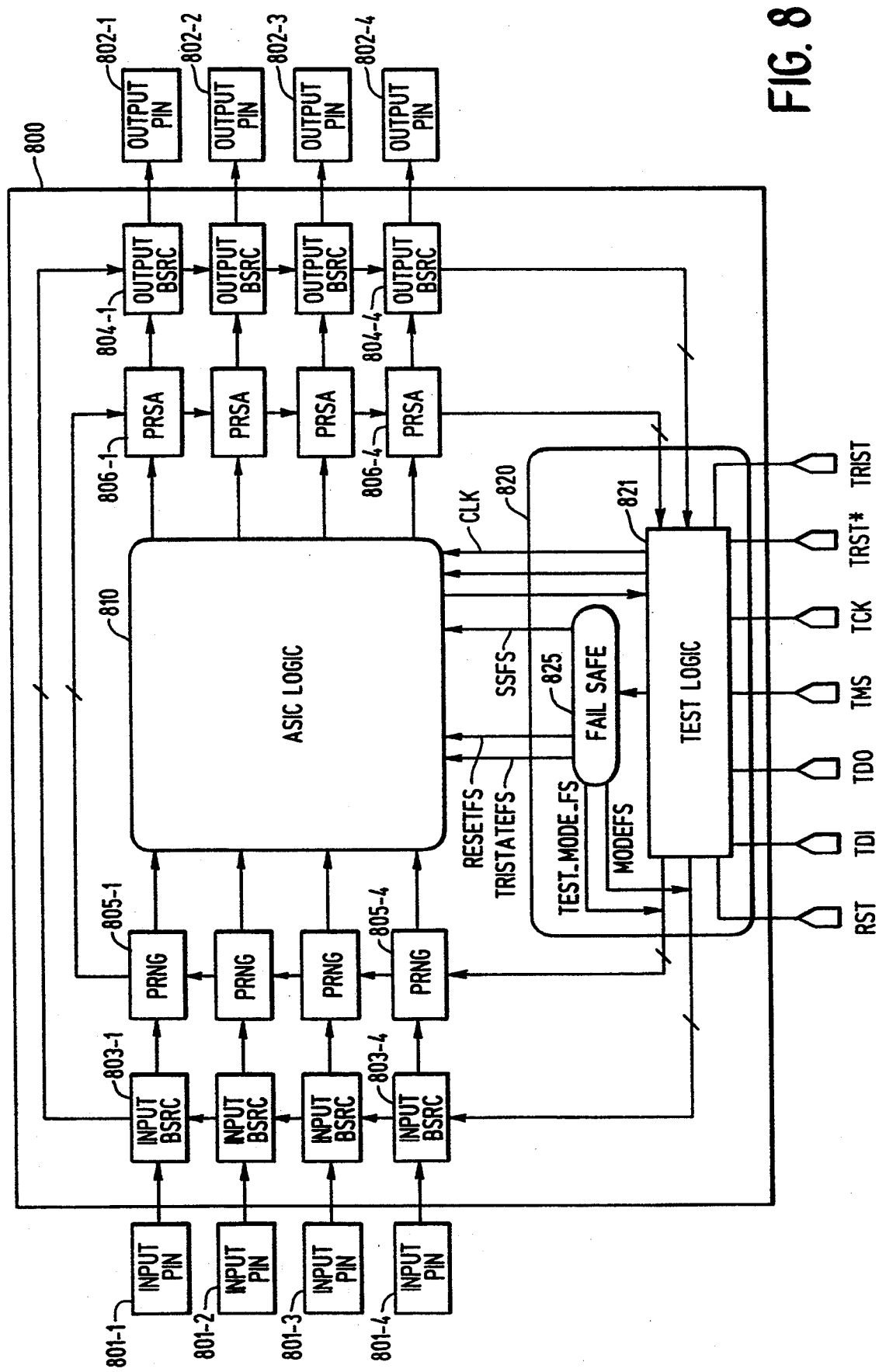
FIG. 8 is a more detailed block diagram of one embodiment of an ASIC that includes a fail-safe circuit within the test logic according to the principles of this invention.

A more detailed embodiment of this invention is illustrated in FIG. 8 where fail-safe circuit 825 of this invention is included in prior art ASIC 100. Specifically, ASIC logic 810, input pins 801-1 to 801-4, input boundary scan cells 803-1 to 803-4, pseudo-random number generator cells 805-1 to 805-4, pseudo-random number signature analyzer cells, 806-1 to 806-4, output boundary scan cell 804-1 to 804-2, output pins 802-1 to 802-4, pins RST, TDI, TDO, TMS, TCK, TRST*, and TRIST have are equivalent to ASIC logic 110, input pins 101-1 to 101-4, input boundary scan cells 103-1 to 103-4, pseudo-random number generator cells 105-1 to 105-4, pseudo-random number signature analyzer cells 106-1 to 106-4, output boundary scan cells 104-1 to 104-2, output pins 102-1 to 102-4, pins RST, TDI, TDO, TMS, TCK, TRST*, and TRIST, respectively, as described above, and that description is incorporated herein by reference. However, as described more completely below, control lines to the various parts of ASIC 800 from test logic 820 that may render ASIC logic 810 inoperable are routed from fail-safe circuit 825 instead of test logic circuitry 821.

Thus, according to the principles of this invention, test logic 820 includes in addition to the prior art test logic circuitry 821, fail-safe circuit 825. Each of the lines carrying control signals from test logic circuitry 821 that may render ASIC 800 inoperable are routed to fail-safe circuitry 825. These lines include RESET, SS, MODE, TRISTATE, and TEST_MODE. Fail-safe circuitry 825 blocks transmission of control signals on these lines generated by test logic circuitry 821 to ASIC logic 810 unless fail-safe circuitry 825 receives an enablement signal.

In this embodiment, the enablement signal to fail-safe circuitry 825 is the signal on pin TRST*. When the signal on pin TRST* is active, i.e., the signal is a logic zero, an enablement signal is provided to fail-safe circuitry 825. Thus, to perform a boundary scan test during manufacturing testing, the signals on pins TDI, TDO, TMS, TCK must be configured in the normal manner and the signal on pin TRST* must be held low.

When test logic circuitry 821 generates an active signal on line MODE for a boundary scan in response to the signals loaded into test logic circuitry 821 from pins TDI, TDO, TMS, TCK. The active signal on line MODE is not applied to cells 803-1 to 803-4 and 804-1 to 804-4, but rather to fail-safe circuit 825. Since the signal on pin TRST* is held low, fail-safe circuit 825 drives the signal on line MODE_FS to cells 803-1 to 803-4 and 804-1 to 804-4 active so that the boundary scan test can proceed.

Conversely, if, after the manufacturing testing is complete and a customer is using the product, test logic circuitry 821 drives the signal on line MODE active, ASIC 800 is unaffected, because the signal on line TRST* is high and consequently fail-safe circuit 825 holds the signal on line MODE_FS inactive. The IEEE 1149.1 standard defines that the customer must power pin TRST*.

The function of fail-safe circuitry 825 for each of the other control signals from test logic circuitry 825 generated only during manufacturing testing is equivalent to that described for the boundary scan capability and so will be apparent to those skilled in the art in view of the above discussion. Nevertheless, to further demonstrate the principles of the invention, one embodiment of test circuitry 821 is briefly described below and a specific embodiment of fail-safe circuitry 825 is then given.

Figure 9:
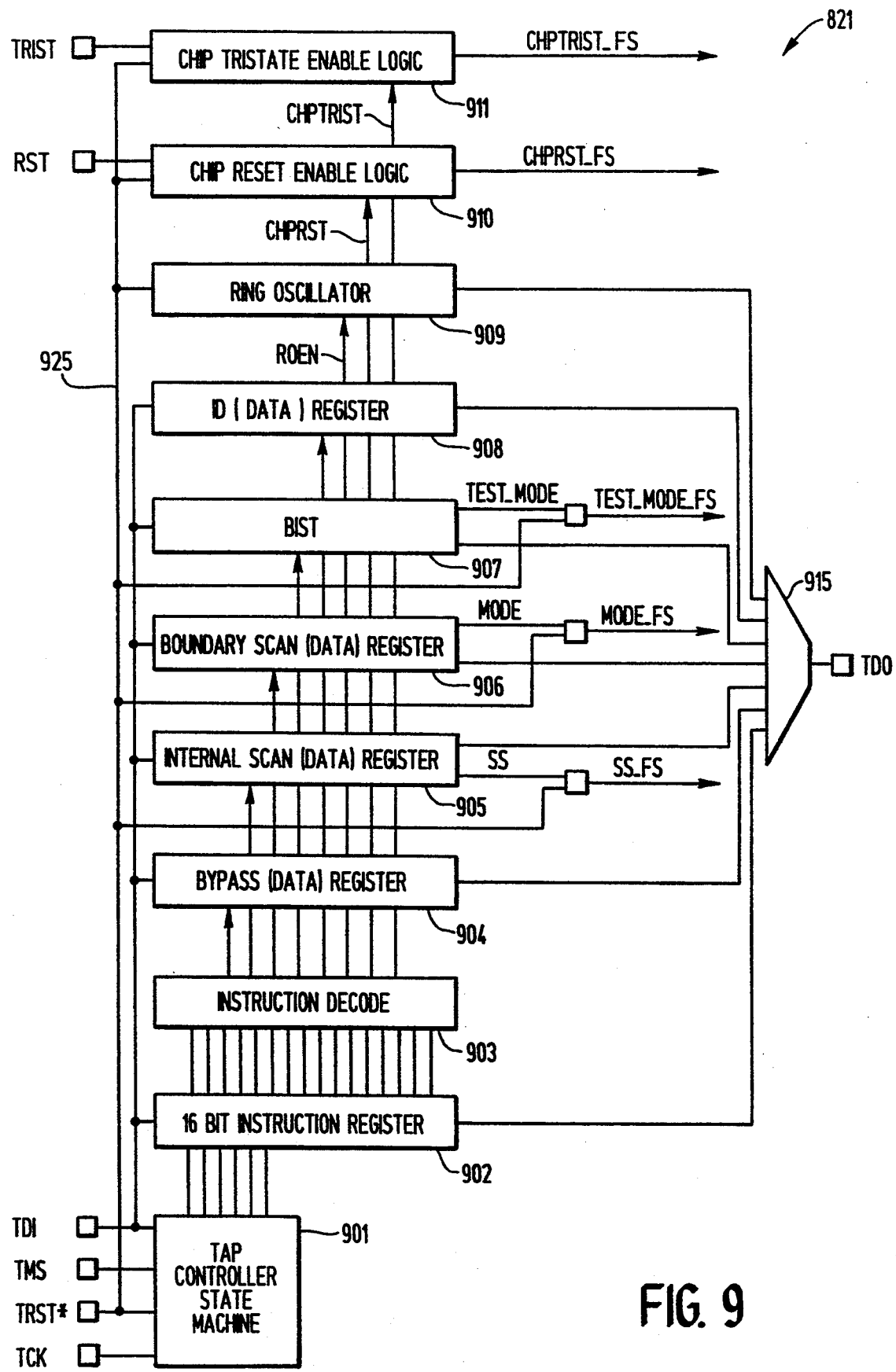
FIG. 9 is a block diagram of one embodiment of test logic circuitry suitable for use with the fail-safe logic circuit of this invention.

A block diagram of the major components in test circuitry 821 is illustrated in FIG. 9. Pins TDI, TMS, TRST* and TCK are connected to TAP controller state machine 901. As described more completely below, TAP controller state machine 901 drives instruction register 902. The bits in instruction register 902 are decoded by instruction decode 903. Instruction decode 903 generates control signals for bypass data register 904, internal scan data register 905, boundary scan data register 906, built-in self test 907, ID data register 908, ring oscillator 909 as well as for chip reset enable logic 910 and chip tristate enable logic 911.

TAP controller state machine 901 has three main portions, an idle state, an instruction register tree, and a data register tree. The instruction and data register trees provide the necessary synchronized signals to control all instruction and data registers in test logic circuitry 821. TAP controller state machine 901 is implemented, in this embodiment, according to the IEEE 1149.1 standard.

Specifically, TAP controller state machine 901 receives serial test data input signals from pin TDI, a test mode select signal from pin TMS, a test clock signal from pin TCK, and an asynchronous test reset signal from pin TRST*, which is also utilized as the fail-safe circuit enable signal.

TAP controller state machine 901 generates signals that include a shift enable signal for instruction register 902, a clock signal for instruction register 902, a parallel output latch enable signal for instruction register 902, a shift enable signal for all data registers SHIFTDR, a clock signal CLOCKDR for all data registers, a parallel output latch enable signal UPDATEDR for the data registers, and a reset signal RESET, for the instruction and data registers.

In this embodiment, instruction register 902 is a sixteen bit register which is serially loaded from pin TDI under control of TAP controller state machine 901. Each instruction register bit is implemented using the architecture recommended in the IEEE 1149.1 standard. The instructions are latched and presented in parallel to instruction decode 903.

When instruction register 902 receives the parallel output latch enable signal from TAP controller state machine 901, each bit in instruction register 902 is latched and the latched bits drive a 16-bit bus. A serial data line connects "bit 15" of instruction register 902 to pin TDO through output multiplexer 915. This line permits serial scanning of data out of instruction register 902 directly to pin TDO for testing instruction register 902 for stuck-at faults. Upon reset, instruction register 902 loads instruction BYPASS, as defined in the IEEE 1149.1 specification.

Figure 10:
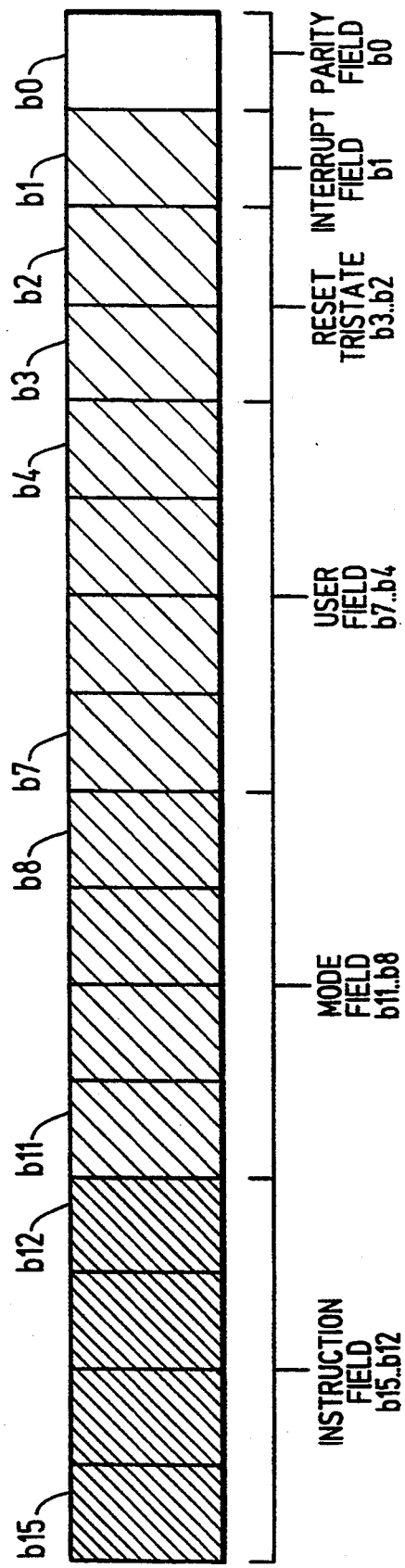
FIG. 10 is a diagram illustrating one embodiment of the assignments to bits b0-b15 of the instruction register of FIG. 9.

Instruction register 902 is broken into six fields, as shown in FIG. 10, which are from more significant bit (MSB) b15 to least significant bit (LSB) b0:

(1) instruction field bits b15 to b12 (4 bits);
(2) instruction mode field bits b11 to b8 (4 bits);
(3) instruction user option field bits b7 to b4 (4 bits);
(4) chip tristate/chip reset bits b3 and b2 (2 bits);
(5) interrupt bit b1—not used, (1 bit); and
(6) parity bit b0—not used, (1 bit).

Of course, the placement of a particular field within the instruction register is a manner of choice and so the embodiment in FIG. 10 is illustrative of only one possible alignment of the fields. Similarly, the number of bits in the instruction register could be longer or shorter, e.g., 8 bits or 32 bits.

In manufacturing testing normal operation, instruction register 902 is loaded by descending the TAP controller state machine instruction register tree. Upon entering the instruction register tree, the signal on the serial shift enable line is held low, and the instruction register clock line is pulsed once. This signal sequence loads a default hardwired value into instruction register 902 (set to BYPASS).

If instruction register 902 is exited at this point, the instruction register parallel output latch enable line is pulsed once, and the instruction is parallel latched at the output terminals of instruction register 902. If a different instruction is desired, immediately after the first pulse on the instruction register clock line, the signal on serial shift enable line goes low, which in turn configures instruction register 902 as a serial register. Sixteen pulses on the instruction register clock line are used to serially load a new instruction from pin TDI. After the sixteen clock pulses, a single pulse on the instruction register parallel output latch enable line latches the sixteen bit instruction on the parallel output terminals of instruction register 902.

Instruction decode 903 takes the latched instruction register parallel output signals and generates the necessary signals on the various control lines required for proper operation of test logic circuitry 821. Instruction decode 903 receives the latched signals on the parallel output terminals of instruction register 902 and the complement of these signals.

Instruction decode 903 is fully asynchronous and decoded signals are available upon the bits in instruction register 902 being latched on the parallel output terminals. One embodiment of the operations performed by instruction decode 903 are given in FIG. 11. Each of the signals generated by instruction decode 903 are described more completely below.

Bypass register 904 is a data register that is required by the IEEE 1149.1 standard. Bypass register 904 provides a connection between pin TDI and pin TDO with a time delay equal to one clock cycle on pin TCK. Bypass register 904 receives the data register signals from TAP controller state machine 901 described above.

To use bypass register 904, instruction BYPASS is first loaded into instruction register 902 via the TAP controller instruction register tree. Instruction BYPASS sets output multiplexer 915 so that the output signal from bypass register 904 is passed through output multiplexer 915 to pin TDO. Next, the TAP controller data register tree is descended and the signal on data register shift enable line goes high which in turn routes the data on pin TDI to bypass register 904. Data are then clocked through output multiplexer 915 to pin TDO pin, each time a pulse is generated on the data register clock line by TAP controller state machine 901. Bypass register 904 is used to bypass an ASIC in a serial chain of ASICs during a serial data transfer between the serial chain of ASICs.

ID data register 908 is, in this embodiment, a 32 bit data register which provides a hardwired binary code that is unique to each individual ASIC. Register 908 is implemented in accordance with the IEEE 1149.1 standard.

In manufacturing testing normal operation, instruction register 902 is first loaded with the instruction via the TAP controller instruction register tree to set output multiplexer 915 to pass therethrough the least significant bit of ID register 908. Next, the TAP controller data register tree is used to provide a single pulse on the data register clock line while the signal on the data register shift enable line is held low. This signal sequence loads the hardwired ID code into ID register 908. Next, the signal on data shift register enable line goes high, reconfiguring ID register 908 into a serial register. The value of the LSB of ID register 908 is immediately available at pin TDO. The remainder of the ID bits are clocked out by supplying 31 more clock pulses on the data register clock line.

Ring oscillator 909 is a multiple inverter stage, e.g., 101 stage, 500 kHz, divide by "x" ring. In this embodiment, "x" is sixty-four. During normal ASIC operation and manufacturing testing, the high frequency internal loop of ring oscillator 909 is disabled to reduce power consumption and on-chip noise. Ring oscillator 909 looks much like a data register, except ring oscillator 909 has no need for the control data lines from TAP controller state machine 901. Instead, ring oscillator 909 is controlled solely by a decoded ring oscillator enable signal ROEN from instruction decode 903. In this embodiment, as described more completely below, the portion of fail-safe circuit 825 for ring oscillator 909 is included within ring oscillator 909.

In manufacturing testing normal operation, the TAP controller instruction register tree is descended and the ring oscillator instruction loaded and parallel latched in instruction register 902. Immediately following the instruction latch, the ring oscillator internal loop is asynchronously enabled and the low frequency output signal passed through output multiplexer 915 to pin TDO.

Figure 12:
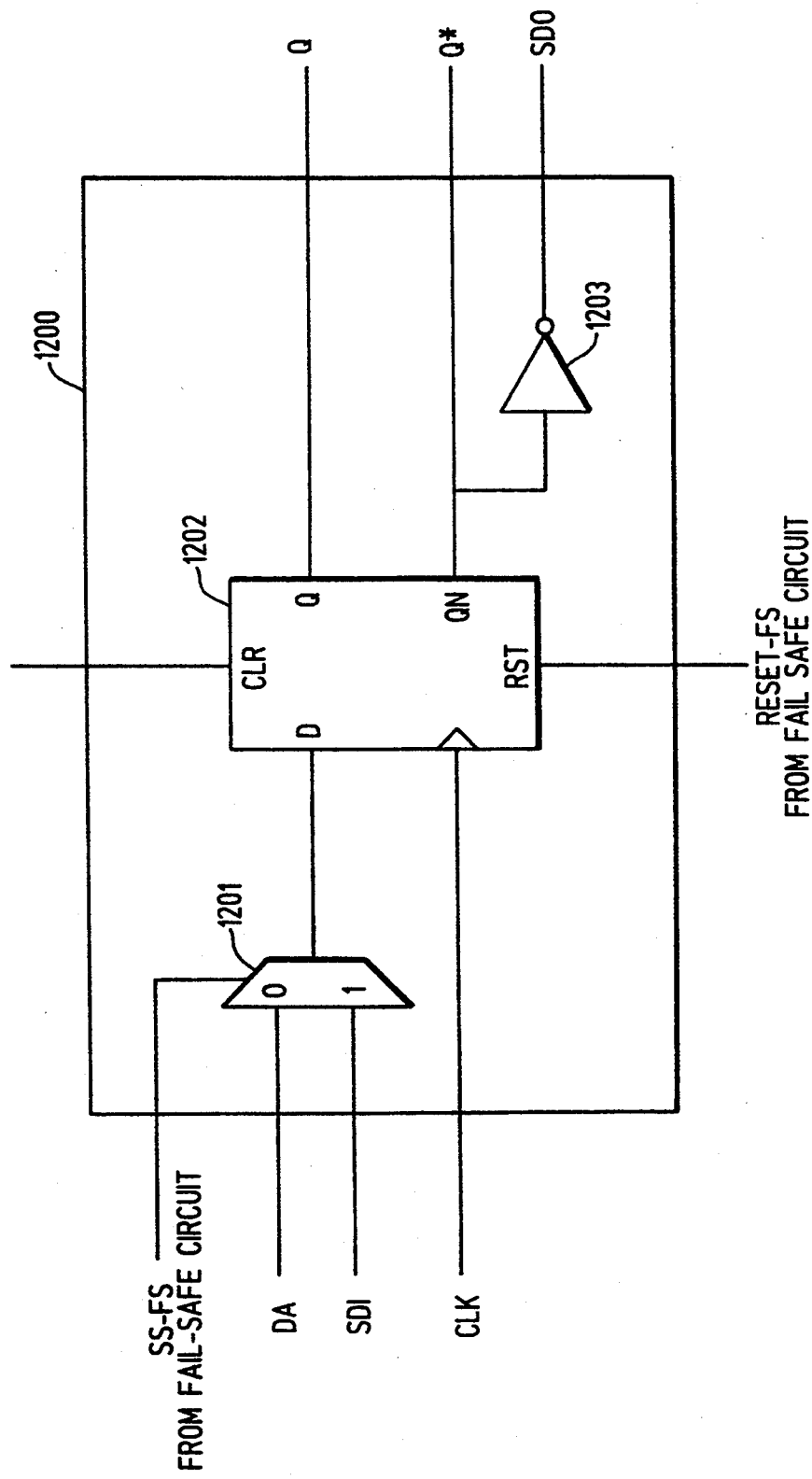
FIG. 12 is a structure within ASIC 800 that is controlled by signals from the fail-safe circuit of this invention so that the manufacturing test internal scan capability and reset capability are fault tolerant.

The internal scan capability is supported with all flip-flops in ASIC logic 810 preferably connected in a chain. Internal scan flip-flops can be configured into either a single loop or multiple loops. In this embodiment, structure 1200 of FIG. 12 is included with each flip-flop 1202 in ASIC logic 710. In another embodiment, inverter 1203 is omitted and scan data out line SDO is tied directly to output terminal Q of flip-flop 1202. The configuration shown is used to reduce loading on output terminal Q of flip-flop 1202 as this is typically a critical net during routing. Structure 1200 includes a line SDI for receiving the serial data from the previous scan flip-flop in the chain; fail-safe scan select line SS_FS to configure structure 1200 to normal or scan orientation; a normal data in line DA; a clock line CLK; a fail-safe reset line RESET_FS; a clear line; a normal output line Q; and a complement output line Q*; and a scan data out line SDO. Lines DA and SDI are input lines to two-to-one multiplexer 1201. The signal passed through multiplexer 1201 to the input terminal D of D-type flip-flop 1202 is determined by the signal on fail-safe scan select line SS_FS, which is described more completely below.

For an internal scan, ASIC 800 is brought to a known state (probably via reset) and the ASIC logic clock is disabled. Instruction ISCAN(load mode) is loaded via the TAP controller instruction register tree into instruction register 902 and the scan chain output signal is selected and passed through output multiplexer 915 to pin TDO. Pin TDI is connected to the scan chain input line, and the signal on line SS goes active. However, the signal on line SS is applied to fail-safe circuit element 825_SS, which drives line SS_FS. Fail-safe circuit element 825_SS generates an active signal on line SS_FS only when the fail-safe enable signal on line 925 is active and the signal on line SS is active. For the remainder of this discussion, it is assumed that the signal on line 925 is active so that when the signal on line SS goes active, the signal on line SS_FS also goes active. When the signal on line SS_FS goes active, structure 1200 is configured for loading data.

Data are presented at pin TDI. The ASIC logic clock is now generated by the TAP controller CLOCKDR state which is used to load the data until the entire scan ring has been loaded. A new instruction, the internal scan (run mode) instruction, is then loaded into instruction register 902 by TAP controller state machine 901. This instruction is decoded and the signal on line SS_FS is driven low so that structure 1200 is in the normal mode. The ASIC logic clock is then clocked once via the TAP controller CLOCKDR state to propagate the loaded values through ASIC logic 810. The internal scan (load mode) instruction is once again loaded into instruction register 901 and, as described above, structure 1200 is configured for scan operation. The sampled data are serially clocked out of the internal scan ring using the ASIC TAP controller CLOCKDR state.

The boundary scan capability is implemented using test logic circuitry 821 (FIG. 9) and two types of boundary scan register cells 1303, 1404. BSRC cells 1303, 1404 have the same components as cells 203, 304, respectively, as described above. In another embodiment, the combination boundary scan register and built-in self-test cells described in copending, commonly filed and commonly assigned U.S. patent application Ser. No. 07/905,973 (PENDING) entitled "A CELL ARCHITECTURE FOR BUILT-IN SELF-TEST OF APPLICATION SPECIFIC INTEGRATED CIRCUITS" of R. Gillenwater et al., which is incorporated herein by reference in its entirety, are utilized. The use of these alternative cells with fail-safe circuit 825 will be apparent to those skilled in the art in view of this disclosure.

Both the input BSRCs 1303 and output BSRCs 1404 share a common signal bus, which includes the following lines: scan data in line SDI, which provides data from the previous BSRC; fail-safe line MODE_FS which carries the two-to-one multiplexer 1314, 1414 control bit; line UPDATEDR, which carries the signal to parallel latch serial data in the BSRC; reset line RESET*; clock line CLOCKDR for serial data shift in the BSRC; line SHIFTDR which carries the multiplexer 1311, 1411 control bit for BSRC serial data shifting; and scan data out line SDO, which carries scan data to the next BRSC.

These control lines are used in different configurations to provide several different operations utilizing the BSRCs. The instructions loaded in instruction register 902 to implement these different operations include instructions SAMPLE/PRELOAD, EXTEST, and INTEST, which are described more completely below.

Figure 13:
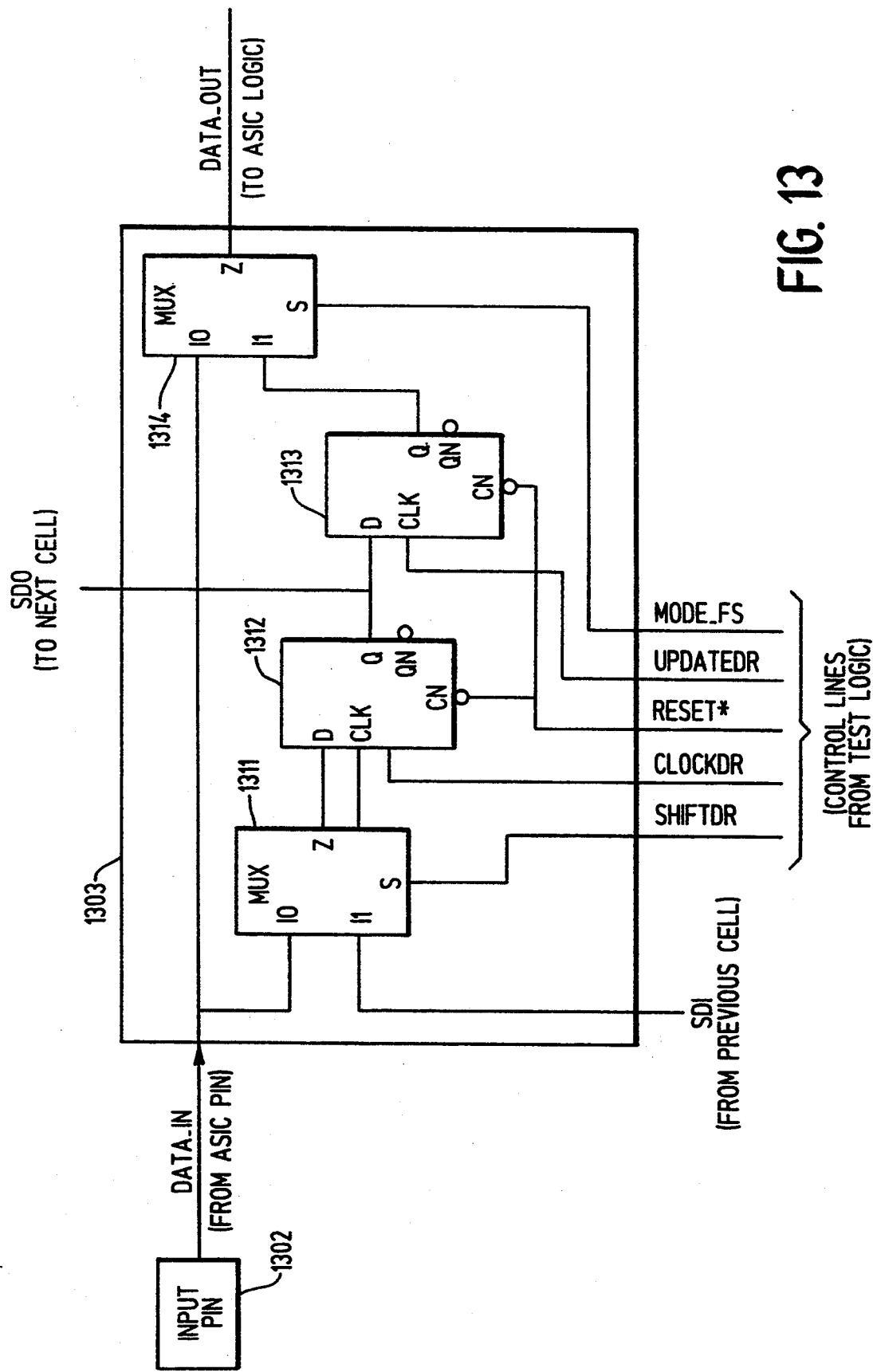
FIG. 13 is a schematic diagram of an input boundary scan register cell whose operation is controlled by the signal on fail-safe line MODE_FS according to the principles of this invention.
Figure 14:
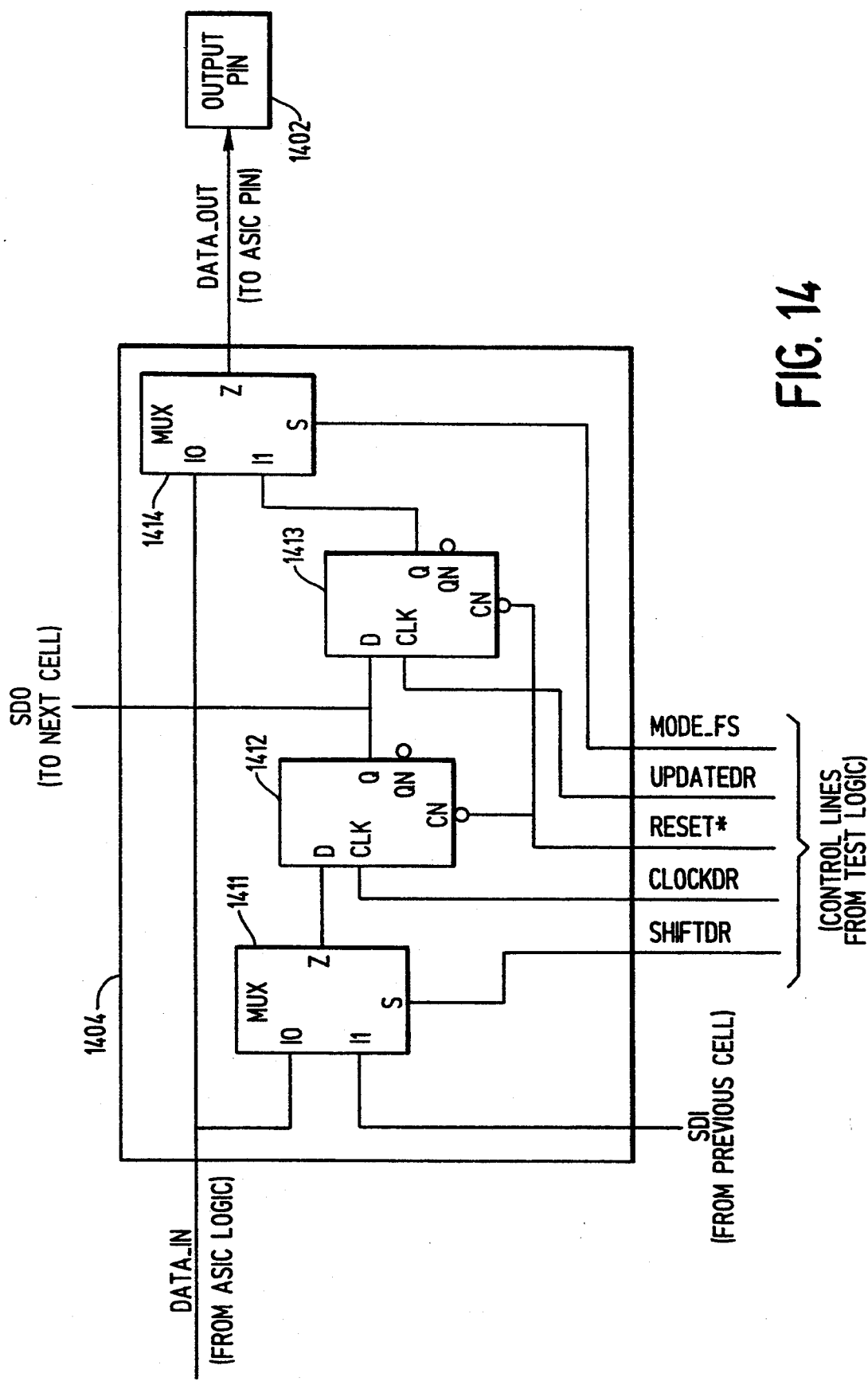
FIG. 14 is a schematic diagram of an output boundary scan register cell whose operation is controlled by the signal on fail-safe line MODE_FS according to the principles of this invention.
Figure 15:
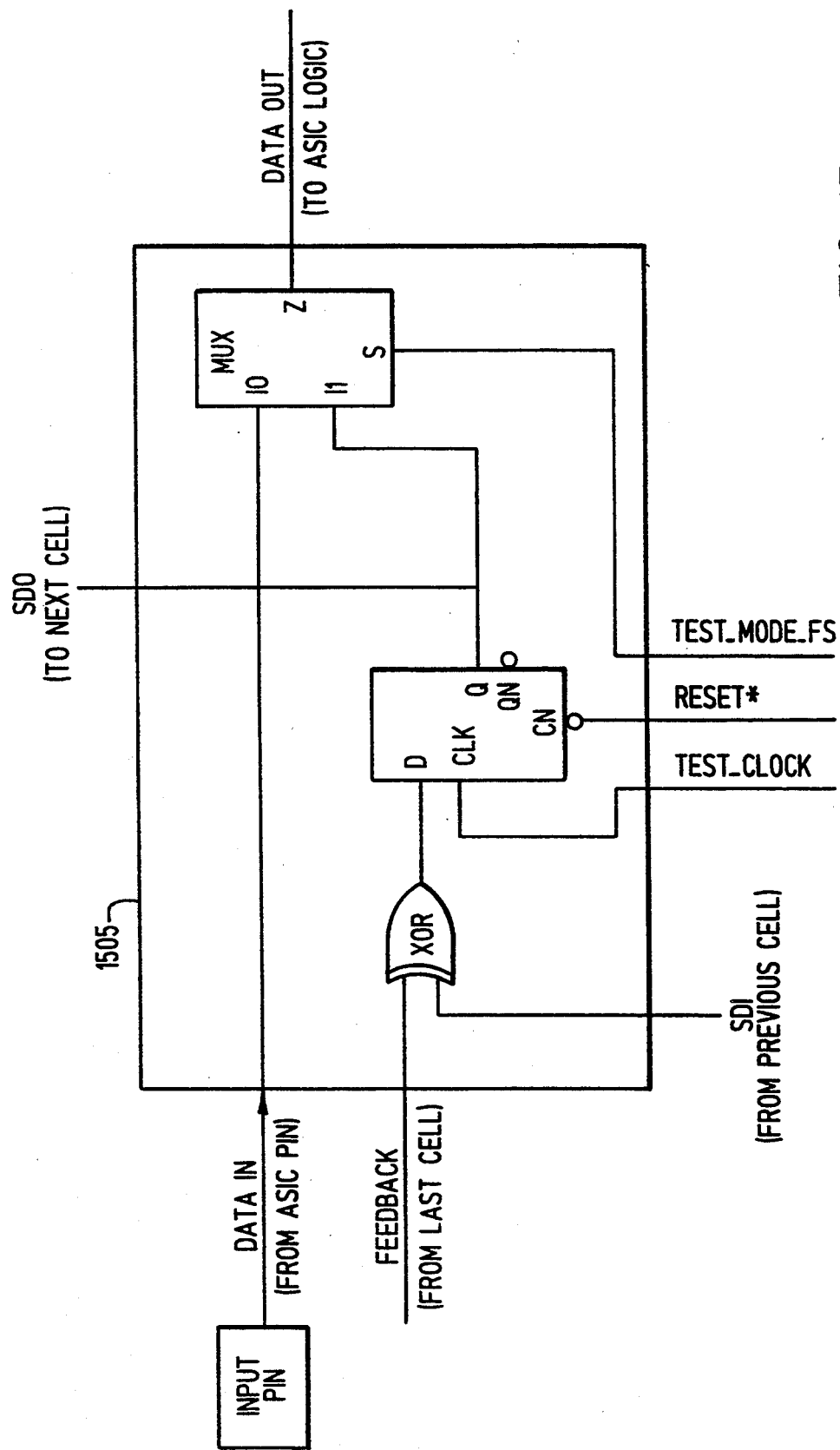
FIG. 15 is a pseudo-random number generator cell whose operation is controlled by the signal of fail-safe line TEST_MODE_FS according to the principles of this invention.
Figure 16:
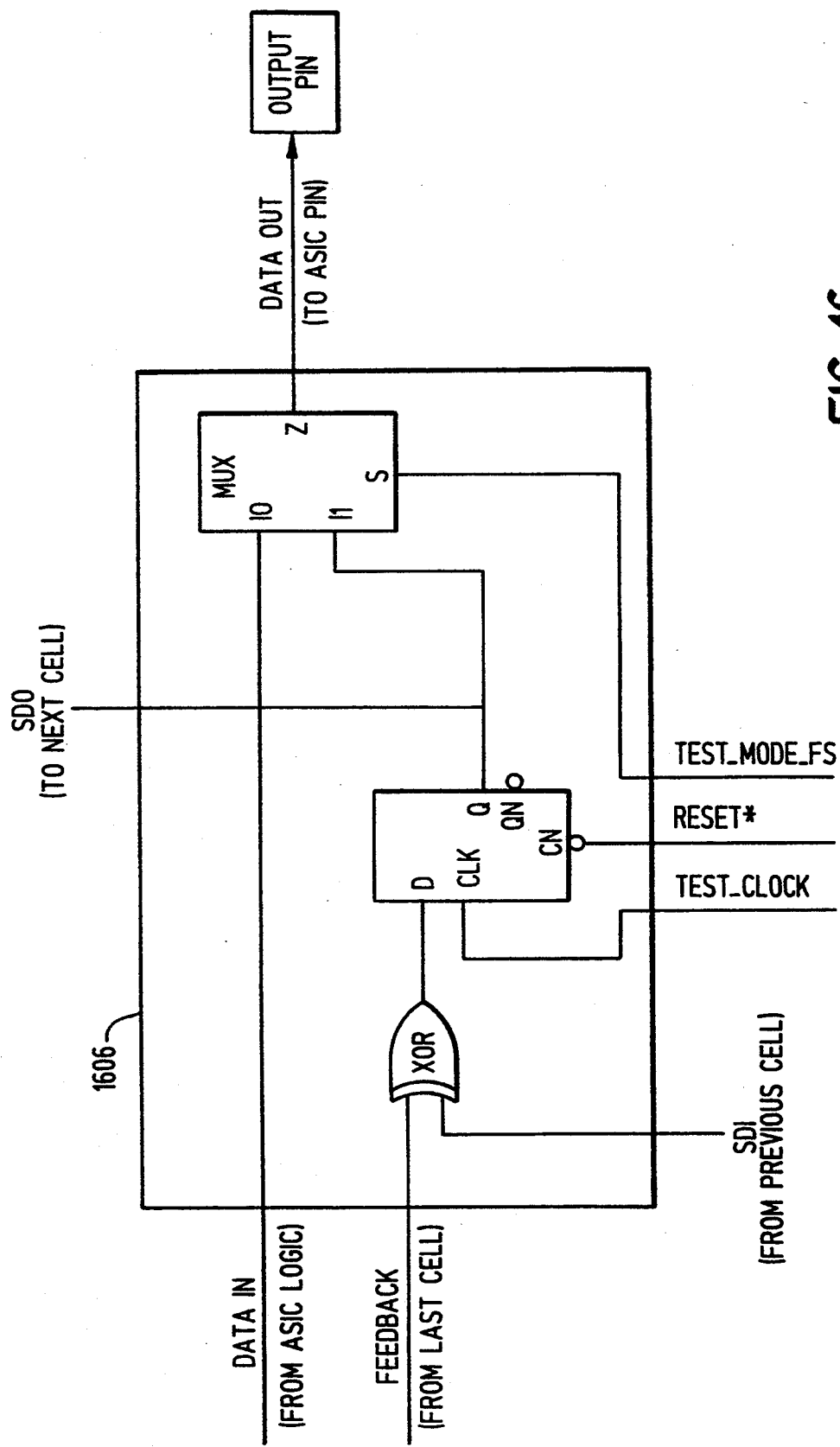
FIG. 16 is a pseudo-random number signature analyzer cell whose operation is controlled by the signal of fail-safe line TEST_MODE_FS according to the principles of this invention.
Figure 17A:
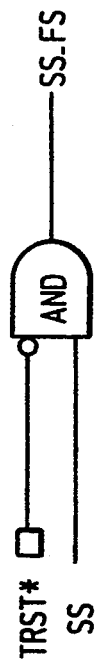
FIGS. 17A to 17F are detailed schematic diagrams of one embodiment of the fail-safe circuitry of this invention.
Figure 17B:
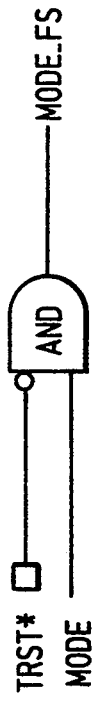
Figure 17C:
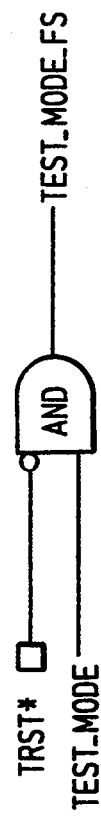
Figure 17D:
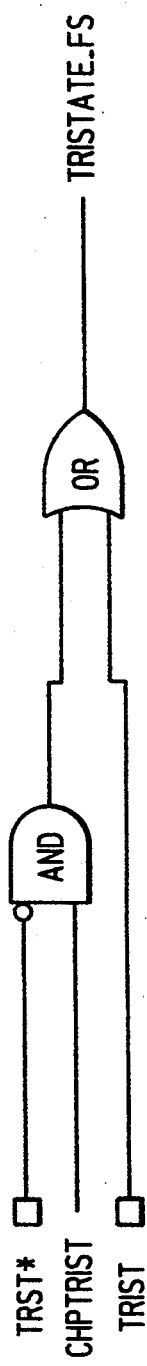
Figure 17E:
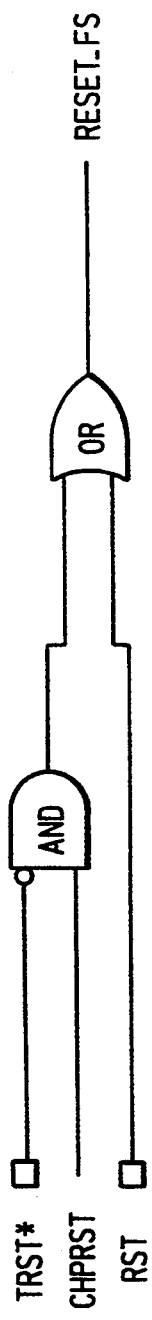
Figure 17F:
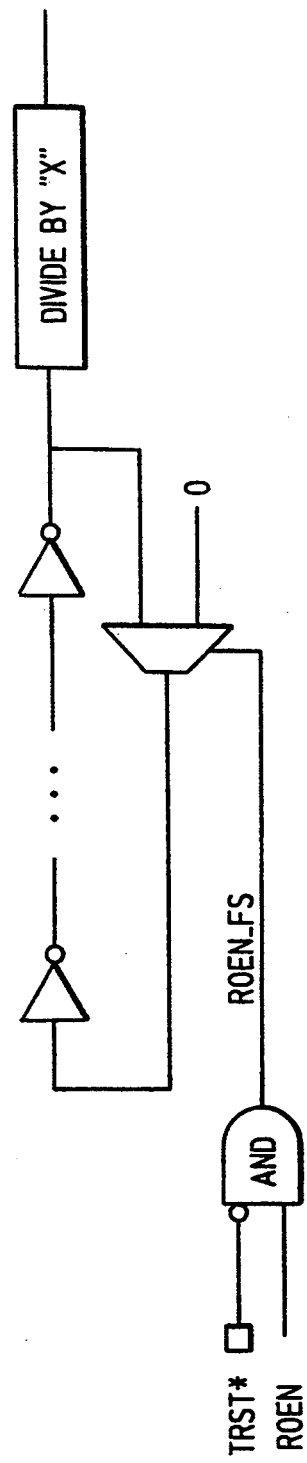

Instruction SAMPLE/PRELOAD is used to either take a "snapshot" of the data at the pins of ASIC 800 (FIG. 8), (SAMPLE mode) or to serially preload data through BSRCs 303, 1404 (FIGS. 13 and 14) without interfering with normal ASIC operation (PRELOAD mode). The SAMPLE/PRELOAD modes are fully described within the IEEE 1149.1 standard and are used to enter and retrieve data for instructions INTEST, EXTEST, and potentially BIST instructions.

In boundary scan testing, instruction SAMPLE/PRELOAD is executed by descending the instruction register tree in the TAP controller state machine 901. After the instruction is latched in instruction register 902 and decoded by instruction decode 903, the BSRCs are reconfigured to permit serial data entry. Serial data entry is accomplished using the TAP controller data register tree to shift data via pin TDI into the BSRCs over lines SDI and SDO. Upon exiting the TAP controller data register tree, the BSRCs have been preloaded for the next instruction.

Instruction INTEST is used to present the data loaded into the BSRCs via instruction PRELOAD to the input lines of ASIC logic 810, and is fully described within the IEEE 1149.1 standard. Thus, the signal on fail-safe line MODE_FS is driven active so that the multiplexer passes the loaded data therethrough to the ASIC input line. Thus, immediately upon execution of instruction INTEST, all data in the BSRCs are presented to ASIC logic. Consequently, instruction INTEST offers a means to present data vectors to ASIC logic.

Instruction EXTEST is similar in operation to instruction INTEST, but instruction EXTEST is used to present data to the ASIC output pins. Instruction EXTEST is also fully described in the IEEE 1149.1 standard. Data are first loaded in the BRSCs using instruction PRELOAD. Next, the TAP controller instruction tree is descended and upon latching instruction EXTEST in instruction register 902 and decoding of that instruction by instruction decode 903, the BSRCs are reconfigured to present the preloaded data to the output pins of ASIC 800. Specifically, the signal on fail-safe line MODE_FS is driven active so that the multiplexers pass the loaded data therethrough to the ASIC output pins.

Specifically, the signal on line MODE to fail-safe circuit element 925-MODE goes active. Circuit element 925-MODE drives the signal on line MODE_FS active only when the signal on fail-safe enable line 925 and the signal on line MODE are both active. For this discussion, it is assumed that the signal on fail-safe enable line 925 is active so that the signal on line MODE goes active, the signal on line MODE_FS also goes active.

The built-in self-test may take a variety of forms and does not form an essential aspect of this invention. The important aspect is that if the built-in self-test utilizes test cells, the signals used to configure the test cells for the test are derived from fail-safe circuit 825. In particular, as described above, the signal on line MODE_FS is driven by fail-safe circuit 825 in response to an enable signal and a signal from instruction decode 903.

Similarly, if pseudo-random number generator cell 1505 and pseudo-random number signature analyzer cell 1606 are used in the built-in self-test, the signal on line TEST_MODE_FS, which is the control bit for the two-to-one multiplexer, is driven by fail-safe circuit 825 in response to the built-in self test run signal from instruction decoder 903.

Instruction CHPTRIST asynchronously tri-states of all ASIC output lines when the signal on fail-safe enable line 925 is active. Instruction CHPTRIST is independent of all other instructions and may be used in conjunction with any other command. For example, in mode BIST, instruction CHPTRIST may be used to tristate all ASIC output lines while the BIST is ran.

Instruction CHPTRIST is executed by descending the instruction tree in the TAP controller state machine and immediately upon latching the instruction in instruction register 902, instruction decode 903 drives the signal on line CHPTRIST high. If the enable signal is present, chip tristate enable logic 911 drives the signal on line CHPTRIST_FS active. If the enable signal is not present, a signal is not generated on line CHPTRIST_FS even though the signal on line CHPTRIST is active.

Pin TRIST also permits asynchronous tri-stating of all ASIC output lines. Typically, the signal from pin TRIST is a first input signal and the signal on line CHPTRIST_FS is a second input signal to a logic OR gate. The function of the signal from pin TRIST is independent of all other instructions.

There are at least two reasons for pin TRIST in addition to instruction CHPTRIST. First, in large designs where several ASICs are present on a single board, it is necessary to tristate all the ASICs while testing other devices. Second, it is uncertain whether the ASIC being tri-stated is itself functional after the manufacturing process. By having to rely on only one pin for the tristate function on the ASIC instead of the five pins required to generate instruction CHPTRIST, the probability of a solder short/open on a critical pin is reduced.

Instruction CHPRST permits asynchronous reset of all ASIC logic, which is necessary for proper ASIC conditioning prior to BIST operation and/or vector application. Instruction CHPRST is independent of all other instructions and thus overrides any other command.

Instruction CHPRST is executed by descending the instruction register tree in the TAP controller state machine 901 and loading instruction RESET in instruction register 902. Immediately upon latching of the instruction in instruction register 902, instruction decode 903 drives the signal on line CHPRST to chip reset enable logic high. If the signal on fail-safe enable line 925 is active, an active signal is generated on line RESET_FS and conversely.

Pin RST permits asynchronous reset of all ASIC logic. The signal from pin RST is a first signal and the signal on line RESET_FS is a second signal to a logic OR gate. Thus, the function of pin RST is independent of all other instructions. Pin RST is supplied for the same reasons as the TRIST pin.

As explained above, there is the possibility that a faulty design or implementation in the test logic circuitry 821 could cause ASIC 800 to be nonfunctional, even through ASIC logic 810 is itself functional. Therefore, to mitigate such a failure, each control line in test logic circuitry 821 that could render ASIC 800 nonfunctional if the signal on the line goes active for what ever reason was routed to fail-safe circuitry 825.

In this embodiment, the signal from pin TRST* is gated with the signal on each of the critical control lines SS, MODE, TEST_MODE, REON, CHPRST AND CHPTRIST so that setting the signal on pin TRST* to logic one forces a hard inhibit of these critical control lines. Thus, even if test logic circuitry 821 is non-functional because the signals on one or more of those critical control lines are stuck-on, ASIC logic 810 is still functional. Therefore, fail-safe circuit 825 not only assists in manufacturing testing as described above, but also provides fault tolerance.

FIGS. 17A to 17F illustrate fail-safe circuitry 825 for each of the six critical control lines SS, MODE, TEST_MODE, REON, CHPTRIST, and CHPRST from the test logic circuitry. In each case, the critical control line is connected to a first input terminal of an AND gate. Fail-safe enable line 925 from pin TRST* is connected to an inverter on a second input terminal of the AND gate. The output line from the AND gate is the fail-safe line for the corresponding critical control line connected to the first input terminal.

Specifically, in the manufacturing tests using the BSRCs (input and output), signal MODE must be forced to a logic zero when the signal on pin TRST* is pulled to a logic zero. In this condition, the BSRCs and built in BIST features are bypassed because the signal on line MODE_FS is inactive. The signal on line SS must be pulled to a logic zero when the signal on pin TRST* is pulled to a logic zero to inhibit configuring the internal scan flip-flops into a serial scan chain. The signal on line CHPTRIST must be pulled to a logic zero when the signal on pin TRST* is pulled to a logic zero to inhibit the automatic tri-stating of all the ASIC logic output lines by accident. Similarly, in manufacturing testing, the signal on each of the other critical control lines must be set at a logic zero when the signal on line TRST* is a logic one to prevent generation of a signal on the fail-safe line that enables operation of that function.

The embodiment of the fail-safe circuit within the test logic of an ASIC that prevents control signals used in manufacturing testing from rendering the ASIC inoperative is illustrative only of the principles of this invention and is not intended to limit the invention to the particular embodiment described. In view of this disclosure, those skilled in the art will be able to implement the fail-safe circuit of this invention with other logic gates and other logic states.

We claim:

1. An integrated circuit comprising:
   an enable signal line for receiving an externally supplied enable signal;
   test logic circuit means having a plurality of intermediate logic circuit control lines; and
   fail-safe circuit means, operatively connected to said enable signal line and to said plurality of intermediate logic circuit control lines wherein a fail-safe signal A_FS is generated by said fail safe circuit means only in response (i) to an externally supplied enable signal on said enable signal line and (ii) to a corresponding intermediate logic circuit control signal A from said test logic circuit means, where signal A is any one of the signals on said plurality of intermediate logic circuit control lines.

2. The integrated circuit of claim 1 wherein said fail-safe circuit means further comprises a plurality of logic gates.

3. The integrated circuit of claim 2 wherein:
   each logic gate includes a first input line, a second input line, and an output line; and further wherein said first input line is connected to said enable signal line;
   said second input line is connected to one line in signal of said plurality of intermediate logic circuit control lines; and
   said output line is driven by a fail-safe signal generated by said logic gate only in response (i) to an externally supplied enable signal on said enable signal line to said first input line and (ii) to a corresponding intermediate logic circuit control signal A from said test logic circuit means on said second input line.

4. The integrated circuit of claim 2 wherein logic gates in said plurality of logic gates comprise AND logic gates.

5. The integrated circuit of claim 1 wherein said integrated circuit further comprises an application specific integrated circuit(ASIC) logic circuit having tri-stateable output lines and said test logic circuit means generates an intermediate logic circuit control signal for tri-stating said tri-stateable output lines as a signal on one of said plurality of intermediate logic circuit control lines whereby said fail-safe signal A_FS is a fail-safe tri-state signal.

6. The integrated circuit of claim 1 wherein said integrated circuit further comprises an application specific integrated circuit(ASIC) logic circuit having a reset line and said test logic circuit means generates an intermediate logic circuit control reset signal as a signal on one of said plurality of intermediate logic circuit control lines whereby said fail safe signal A_FS is a fail-safe reset signal.

7. The integrated circuit of claim 1 wherein said integrated circuit further comprises a test reset pin.

8. The integrated circuit of claim 7 wherein said test reset pin is connected to said enable signal line.

9. An integrated circuit comprising:
   a first logic circuit;
   a second logic circuit operatively coupled to said first logic circuit wherein at least one signal generated by said second logic circuit is an intermediate signal for controlling the operation of said fist logic circuit; and
   fail-safe circuit means operatively connected to said first and second logic circuits and responsive to said at least one signal wherein said fail-safe circuit means generates a fail-safe signal for said first logic circuit only in response to said at least one signal and an externally supplied fail-safe enable signal.

10. The integrated circuit of claim 9 wherein said first logic circuit comprises an ASIC logic circuit for generating an output signal in response to a plurality of input signals; and wherein said ASIC logic circuit includes a plurality of input lines and an output line.

11. The integrated circuit of claim 10 wherein said second logic circuit comprises a built-in test circuit and further wherein said built-in test circuit generates an intermediate control signal to control application of input signals on said plurality of input lines of said ASIC logic circuit.

12. The integrated circuit of claim 11 wherein said built-in test circuit comprises a boundary scan register cell.

13. The integrated circuit of claim 11 wherein said built-in test circuit comprises a pseudo-random number generator cell.

14. The integrated circuit of claim 12 wherein said boundary scan register cell comprises a multiplexer having an output line coupled to one input line of said ASIC logic circuit.

15. The integrated circuit of claim 14 wherein said intermediate control signal comprises a control bit for said multiplexer so that the fail-safe signal generated by said fail-safe circuit means in response to said control bit and to said externally supplied fail-safe enable signal controls the input signal applied to said one input line of said ASIC logic circuit.

16. The integrated circuit of claim 13 wherein said pseudo-random number generator cell comprises a multiplexer having an output line coupled to one input line of said ASIC logic circuit.

17. The integrated circuit of claim 16 wherein said intermediate control signal comprises a control bit for said multiplexer so that the fail-safe signal generated by said fail-safe circuit means in response to said control bit and to said externally supplied fail-safe enable signal controls the input signal applied to said one input line of said ASIC logic circuit.

18. An integrated circuit comprising:
  means for receiving an externally supplied enable signal;
  test logic means for generated a plurality of intermediate logic circuit control signals; and
  fail-safe circuit means, operatively connected to said enable signal receiving means and to said plurality of intermediate logic circuit control signals, for generating a plurality of fail-safe signals for controlling the operation of a logic circuit wherein a fail-safe signal A_FS is generated only in response (i) to an externally supplied enable signal from said enable signal receiving means and (ii) to a corresponding intermediate logic circuit control signal A from said test logic means, where A is any one of the signals in said plurality of intermediate logic circuit control signals.

19. The integrated circuit of claim 18 wherein said fail-safe circuit means further comprises a plurality of logic gates wherein;
  each logic gate includes a first input line, a second input line, and an output line; and further wherein
  said first input line is connected to said means for receiving an externally supplied enable signal;
  said second input line is connected to one signal in said plurality of intermediate logic circuit control signals; and
  said output line is driven by a fail-safe signal generated by said logic gate only in response (i) to an enable signal from said enable signal receiving means on said first input line and (ii) to a corresponding intermediate logic circuit control signal A from said test logic means on said second input line.

20. The integrated circuit of claim 19 wherein said logic gate comprises an AND logic gate.

21. The integrated circuit of claim 20 wherein said integrated circuit further comprises an application specific integrated circuit (ASIC) logic circuit having tri-stateable output lines and said test logic means generates an intermediate logic circuit control signal for tri-stating said tri-stateable output lines as one signal in said plurality of intermediate logic circuit control signals.

22. A method for eliminating ASIC test logic faults comprising the steps of:
  (a) passing control signals from an ASIC test logic circuit to a fail-safe circuit;
  (b) generating a fail-safe control signal from said fail-safe circuit only in response to one of said control signals and a fail-safe enable signal received from an external source.

* * * * *